US008691666B2

(12) United States Patent
Segawa et al.

(10) Patent No.: US 8,691,666 B2
(45) Date of Patent: Apr. 8, 2014

(54) METHOD FOR PRODUCING CHIP WITH ADHESIVE APPLIED

(75) Inventors: Takeshi Segawa, Tokyo (JP); Naofumi Izumi, Tokyo (JP)

(73) Assignee: Lintec Corporation, Tokyo (JP)

( * ) Notice: Subject to any disclaimer, the term of this patent is extended or adjusted under 35 U.S.C. 154(b) by 1210 days.

(21) Appl. No.: 12/596,047

(22) PCT Filed: Apr. 15, 2008

(86) PCT No.: PCT/JP2008/057312
§ 371 (c)(1),
(2), (4) Date: Oct. 15, 2009

(87) PCT Pub. No.: WO2008/129976
PCT Pub. Date: Oct. 30, 2008

(65) Prior Publication Data
US 2010/0144120 A1 Jun. 10, 2010

(30) Foreign Application Priority Data
Apr. 17, 2007 (JP) .................................. 2007-108150

(51) Int. Cl.
*H01L 21/78* (2006.01)
*H01L 21/46* (2006.01)
*H01L 21/301* (2006.01)

(52) U.S. Cl.
USPC ........... 438/464; 438/114; 438/455; 438/458; 438/465; 257/E21.214; 257/E21.26

(58) Field of Classification Search
None
See application file for complete search history.

(56) References Cited

U.S. PATENT DOCUMENTS 4,778,326 A * 10/1988 Althouse et al. .............. 414/800
7,060,532 B2 * 6/2006 Takyu et al. .................. 438/114
(Continued)

FOREIGN PATENT DOCUMENTS

| CN | 1894787 A | 1/2007 |
|---|---|---|
| JP | 2044751 A | 2/1990 |

(Continued)

*Primary Examiner* — Zandra Smith
*Assistant Examiner* — Khanh Duong
(74) *Attorney, Agent, or Firm* — The Webb Law Firm

(57) ABSTRACT

A method for producing a chip (13) in which a die bonding adhesive layer (24) and a wafer (1) are laminated on a close-contact layer (31) of a fixing jig (3), the chip is formed by completely cutting the wafer and the die bonding adhesive layer and then the chip is picked up together with the die bonding adhesive layer from the fixing jig by deforming the close-contact layer of the fixing jig. In the method the fixing jig is provided with the close-contact layer and a jig base (30) that is provided with a plurality of protrusions (36) on one side and a sidewall (35) at the outer circumference section of the one side. The close-contact layer is laminated on the surface of the jig base provided with the protrusions and is bonded on the upper surface of the sidewall. On the surface of the jig base provided with the protrusions, a partitioned space is formed by the close-contact layer, the protrusions, and the sidewall. The jig base is provided with at least one through hole (38) penetrating the outside and the partitioned space, and the close-contact layer can be deformed by sucking air from the partitioned space via the through hole of the fixing jig.

10 Claims, 13 Drawing Sheets

(56) References Cited

U.S. PATENT DOCUMENTS

| | | |
|---|---|---|
| 7,060,593 B2 | 6/2006 | Kurosawa et al. |
| 7,300,818 B2 | 11/2007 | Kurosawa et al. |
| 7,632,374 B2 * | 12/2009 | Ozono et al. ............... 156/707 |
| 7,637,714 B2 | 12/2009 | Kabeshita et al. |
| 7,875,501 B2 * | 1/2011 | Tanaka et al. ............... 438/113 |
| 8,101,436 B2 * | 1/2012 | Takekoshi .................. 438/18 |
| 2002/0067982 A1 * | 6/2002 | Yasumura et al. ............. 414/589 |

FOREIGN PATENT DOCUMENTS

| | | |
|---|---|---|
| JP | 6089912 A | 3/1994 |
| JP | 2001060618 A | 3/2001 |
| JP | 2003179126 A | 6/2003 |
| JP | 2004311980 A | 11/2004 |
| JP | 2006245351 A | 9/2006 |
| JP | 2008103493 A | 5/2008 |
| WO | 2007013619 A1 | 2/2007 |

* cited by examiner (A)

(B)

(C)

METHOD FOR PRODUCING CHIP WITH ADHESIVE APPLIED

TECHNICAL FIELD

The present invention relates to a method for producing a chip with an adhesive applied in which an adhesive is disposed on a surface of the chip. More specifically, the present invention relates to a method for producing an individual chip with an adhesive applied without damage from a wafer that has been ground to be extremely thin.

BACKGROUND ART

In the case in which a semiconductor chip is mounted on a substrate for a semiconductor device, an adhesive in a film shape is used for a die bonding. The adhesive in a film shape is applied to a semiconductor wafer in advance, and a dicing is carried out for the semiconductor wafer together with the adhesive in a film shape to produce a chip with an adhesive applied. Unlike an adhesive in a paste form, an adhesive in a film shape does not run off the edge of the chip. In addition, an uneven application of an adhesive in a film shape does not cause a chip to be inclined. Consequently, an adhesive in a film shape is used as an adhesive between chips of a semiconductor device of a chip stack type in which a plurality of semiconductor chips are stacked on each other in particular.

Moreover, a diffusion of a mobile electronic device and an IC card has been progressed and much further thinning of a semiconductor component has been desired. Consequently, a conventional semiconductor chip having a thickness of approximately 350 µm has to be further thinner to be in the range of 50 to 100 µm or less. In the nature of things, a chip with an adhesive applied in which an adhesive in a film shape is used is desired even for such an extremely thin semiconductor chip.

An adhesive in a film shape is supplied in a form of a lamination with a dicing sheet to be carried out a dicing of a wafer in some cases. In this case, a pressure sensitive adhesive layer of a dicing sheet and an adhesive layer in a film shape become a detachment interfacial surface in a pickup. To pick up a chip that has been bonded to the layers by using a pickup needle, a pushing up force stronger than normal is required. In that case, an extremely thin chip may be damaged. An adhesive in a film shape is applied by a thermal compression bonding to a wafer. Depending on heating, pressurization, and a period that has elapsed from a lamination, an adhesive force of an interfacial surface of a pressure sensitive adhesive layer of a dicing sheet and an adhesive layer in a film shape has a tendency to be increased. Consequently, it is more difficult to pick up a chip in safety.

On the other hand, an adhesive sheet that is provided with an adhesive layer detachably laminated on a substrate and that is used for both a dicing and a die bonding has been placed on the market without separately using a dicing sheet. Such an adhesive sheet does not have a problem of an increase in an adhesive force of an interfacial surface due to a lamination of a pressure sensitive adhesive layer and an adhesive layer. However, a period in which the adhesive sheet can be used must be set to be shorter disadvantageously to obtain a stable pickup force.

In the case in which a pickup force is large as described above, a semiconductor device in which a chip that has been damaged internally is used possesses lower reliability, for instance, a package crack occurs by receiving a heat history even in the case in which the chip is not damaged from the standpoint of appearance.

To solve such problems, a pickup method with an adhesive applied in which the pushing up of a chip by means of a fine needle is not carried out is examined (see Patent document 1). In the pickup method, a suction table of a porous material is used in place of a pressure sensitive adhesive tape, and a suction of a suction table is stopped to cancel the holding force of a chip in the case in which a chip is picked up. However, in this method, a gap between chips cannot be blocked and an air leaks. Moreover, a leak amount increases as a chip is picked up. By this, a holding force to a remaining chip that is not picked up is reduced, and a location of a chip is out of alignment by a vibration, whereby a collet cannot catch a chip unfortunately.

Patent document 1: Japanese Patent Application Laid-Open publication No. 2003-179126

The present invention was made in consideration of the above problems, and an object of the present invention is to provide a method for producing a chip with an adhesive applied wherein a pickup is involved in which the pushing up of a chip is not required and a force for holding a chip that is not picked up is not varied as a pickup is progressed.

SUMMARY OF THE INVENTION

In order to achieve the above object, a method for producing a chip with an adhesive applied in accordance with the present invention is characterized in that a die bonding adhesive layer and a wafer are laminated on an close-contact layer of a fixing jig, a chip is formed by completely cutting the wafer and the die bonding adhesive layer and then the chip is picked up together with the die bonding adhesive layer from the fixing jig by deforming the close-contact layer of the fixing jig, the fixing jig comprising the close-contact layer and a jig base that is provided with a plurality of protrusions on one side and a sidewall having a height almost equivalent to that of the protrusion at the outer circumference section of the one side, wherein the close-contact layer is laminated on the surface of the jig base provided with the protrusions and is bonded on the upper surface of the sidewall;

a partitioned space is formed by the close-contact layer, the protrusions, and the sidewall on the surface of the jig base provided with the protrusions;

the jig base is provided with at least one through hole penetrating the outside and the partitioned space; and the close-contact layer can be deformed by sucking an air in the partitioned space via the through hole of the fixing jig.

For the method for producing a chip with an adhesive applied in accordance with the present invention, it is preferable that the die bonding adhesive layer and the wafer are laminated in this order via a release sheet on an close-contact layer of a fixing jig.

Moreover, for the method for producing a chip with an adhesive applied in accordance with the present invention, the wafer and the die bonding adhesive layer can also be laminated in this order via a protective pressure sensitive adhesive sheet on an close-contact layer of a fixing jig.

Moreover, for the method for producing a chip with an adhesive applied in accordance with the present invention, the wafer, the die bonding adhesive layer, and a release sheet for protecting the die bonding adhesive layer can also be laminated in this order on an close-contact layer of a fixing jig.

As described above, the present invention can also be applied to the case in which chips are formed by completely cutting the wafer on the fixing jig.

Furthermore, a method for producing a chip with an adhesive applied in accordance with the present invention is characterized in that a die bonding adhesive layer and a segmented wafer are laminated on an close-contact layer of a fixing jig, the die bonding adhesive layer is completely cut with the shape of a chip, and then the chip is picked up together with the die bonding adhesive layer from the fixing jig by deforming the close-contact layer of the fixing jig, the fixing jig comprising the close-contact layer and a jig base that is provided with a plurality of protrusions on one side and a sidewall having a height almost equivalent to that of the protrusion at the outer circumference section of the one side, wherein the close-contact layer is laminated on the surface of the jig base provided with the protrusions and is bonded on the upper surface of the sidewall;

a partitioned space is formed by the close-contact layer, the protrusions, and the sidewall on the surface of the jig base provided with the protrusions;

the jig base is provided with at least one through hole penetrating the outside and the partitioned space; and the close-contact layer can be deformed by sucking an air in the partitioned space via the through hole of the fixing jig.

For the method for producing a chip with an adhesive applied in accordance with the present invention, it is preferable that the die bonding adhesive layer and the segmented wafer are laminated in this order via a release sheet on an close-contact layer of a fixing jig.

Moreover, for the method for producing a chip with an adhesive applied in accordance with the present invention, the segmented wafer and the die bonding adhesive layer can also be laminated in this order via a protective pressure sensitive adhesive sheet on an close-contact layer of a fixing jig.

Moreover, for the method for producing a chip with an adhesive applied in accordance with the present invention, the segmented wafer, the die bonding adhesive layer, and a release sheet for protecting the die bonding adhesive layer can also be laminated in this order on an close-contact layer of a fixing jig.

As described above, the present invention can also be applied to the case in which the wafer that has been segmented to a lot of chips in advance in a separate step is disposed on a fixing jig.

By the method for producing a chip with an adhesive applied in accordance with the present invention, the chip can be picked up by only the suction force of the suction collet without the pushing up of the chip using a fine needle. Consequently, the chip is not damaged. Moreover, even in the case in which chips are picked up continuously, a contact state with a chip that remains on the fixing jig does not vary. Consequently, an operation for adjusting a suction force for preventing a displacement of a chip is not required in the later step of the pickup.

Consequently, even for a chip that has been processed to be extremely thin, the chip can be picked up and transferred to the die bonding step in safety.

BEST MODE OF CARRYING OUT THE INVENTION

Presently preferred embodiments of the present invention will be described below in detail with reference to the drawings.

[Fixing Jig]

At first, a fixing jig that is used for the present invention will be described below. The fixing jig shown in FIG. 1 is used in a method for producing a chip with an adhesive applied in accordance with the present invention.

Figure 1:
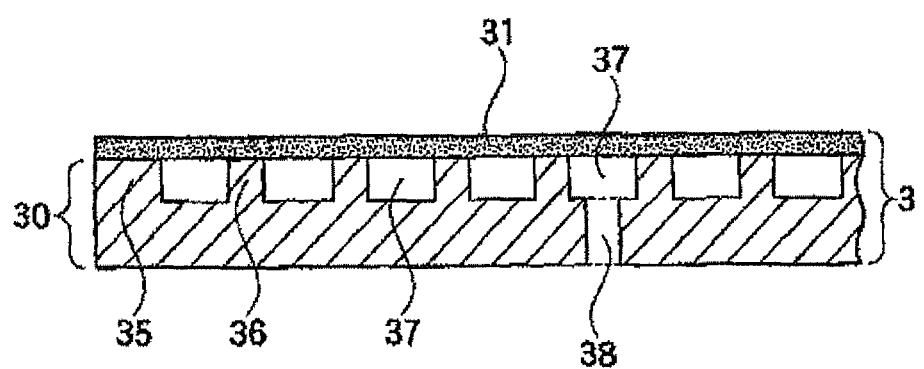
FIG. 1 is a schematic cross-sectional view showing affixing jig that is used in a method for producing a chip with an adhesive applied in accordance with the present invention.
Figure 2:
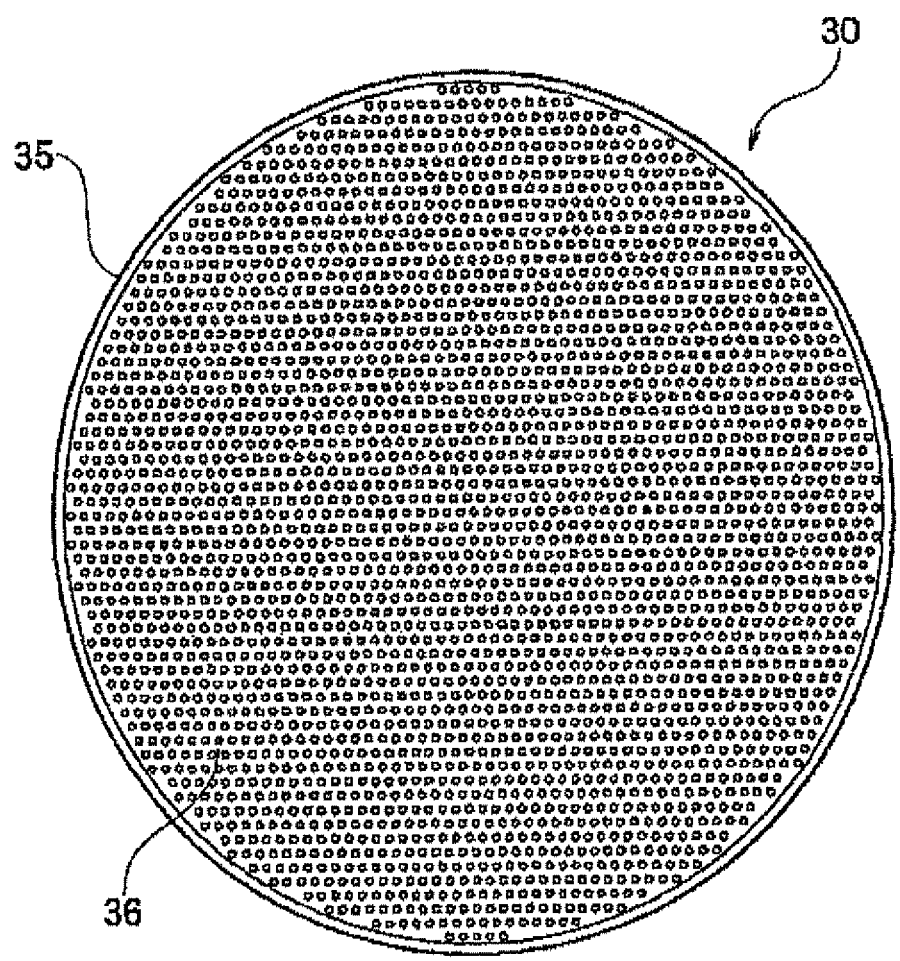
FIG. 2 is a schematic plan view showing a jig base that configures the fixing jig shown in FIG. 1.

As shown in FIG. 1, a fixing jig 3 that is used for the present invention is composed of a jig base 30 and an close-contact layer 31. As a shape of the jig base 30, there can be mentioned for instance a generally circular shape, a generally elliptical shape, a generally rectangular shape, and a generally polygonal shape, and a generally circular shape is preferable. As shown in FIGS. 1 and 2, a plurality of protrusions 36 is formed on one face of the jig base 30 in such a manner that the protrusions 36 space out from each other and protrude upward. A shape of the protrusions 36 is not restricted in particular. However, a cylindrical shape or a circular truncated cone shape is preferable. A sidewall 35 having a height almost equivalent to that of the protrusion 36 is formed on the outer circumference section of the face on which the protrusions 36 are formed. In addition, the close-contact layer 31 is laminated on the face on which the protrusions 36 are formed. The close-contact layer 31 is bonded to the upper face of the sidewall 35. The close-contact layer 31 and the upper face of the protrusions 36 is preferred to be bonded to each other or not to be bonded. The partitioned spaces 37 are formed by the protrusions 36, the sidewall 35, and the close-contact layer 31 on the face provided with the protrusions for the jig base 30. The partitioned spaces 37 are communicated as a whole.

On the other hand, on the face on which the protrusions 36 are not formed for the jig base 30, a through hole 38 that penetrates between the outside on the face side and the partitioned space 37 is formed in a direction of a thickness of the jig base 30. At least one through hole 38 is formed in the jig base 30. A plurality of through holes can also be formed. In place of the through hole 38 on the face on which the protrusions are not formed for the jig base 30, a through hole 38 can also be formed in a horizontal direction of the jig base 30, and an opening part can be formed on the sidewall 35. By connecting a vacuum apparatus detachably to the opening part of the through hole 38, a gas in the partitioned space 37 is exhausted, and the close-contact layer 31 can be deformed in a concave-convex shape.

The material of the jig base 30 is not restricted in particular in the case in which the jig base 30 has a large mechanical strength. As the material of the jig base 30, there can be mentioned for instance a thermoplastic resin such as polycarbonate, polypropylene, polyethylene, a polyethylene terephthalate resin, an acrylic resin, and polyvinyl chloride, and a metallic material such as an aluminum alloy, a magnesium alloy, and stainless steel, and an inorganic material such as glass, and an organic/inorganic composite material such as a glass fiber reinforced epoxy resin. It is preferable that a modulus of elasticity in bending for the jig base 30 is at least 1 GPa. In the case in which the jig base 30 has such modulus of elasticity in bending, the jig base 30 can have stiffness even if a thickness of the jig base 30 is not more than necessary. By using such material, the jig base is not bent in a transfer from a contact of a chip to the fixing jig 3 to mounting of the chip on the pickup apparatus, thereby preventing a displacement and a dropout of a chip.

It is preferable that an outside diameter of the jig base 30 is almost equivalent to or larger than that of a semiconductor wafer. In the case in which the jig base 30 has an outside diameter that can correspond to the maximum diameter of a standardized size of a semiconductor wafer (for instance 300 mm diameter), the jig base 30 can be applied to all of semiconductor wafers having a diameter smaller than the maximum diameter of a standardized size. Moreover, it is preferable that a thickness of the jig base 30 is in the range of 0.5 to 2.0 mm, more preferably in the range of 0.5 to 0.8 mm. In the case in which a thickness of the jig base 30 is in the above range, a wafer can be held without bending the wafer after grinding the rear face of the wafer.

It is preferable that a height of the protrusion 36 and the sidewall 35 is in the range of 0.05 to 0.5 mm. Moreover, it is preferable that a diameter of the upper face of the protrusion 36 is in the range of 0.05 to 1.0 mm. Moreover, it is preferable that an interval between the protrusions (a center-to-center distance of the protrusions) is in the range of 0.2 to 2.0 mm. In the case in which a size of the protrusion 36 and an interval between the protrusions are in the above ranges, the close-contact layer 31 can be deformed sufficiently in a concave-convex shape due to a deaeration in the partitioned space 37, and a semiconductor chip can be easily detached from the close-contact layer 31. Moreover, the close-contact layer 31 can be restored to an original flat state even after a concavoconvex deformation of the close-contact layer 31 is repeated many times.

A diameter of the through hole 38 is not restricted in particular. However, it is preferable that a diameter of the through hole 38 is 2 mm or less.

For the jig base 30, the bottom part, the sidewall 35, and the protrusion 36 of the jig base can be produced in an integrated manner by hot-forming thermoplastic resin materials using a mold. Alternatively, the jig base can be produced by forming the sidewall 35 and the protrusion 36 on a flat circular plate. Alternatively, the jig base can be produced by forming the protrusion 36 on the surface in a concave portion of a depressed circular plate. As a forming method of the protrusion 36, there can be mentioned for instance a method for depositing metal in a prescribed shape by electroforming, a method for forming a protrusion by screen printing, and a method for laminating a photoresist on a flat circular plate and for forming a protrusion by an exposure and a development. Moreover, the jig base 30 can also be produced by a method for eroding and removing the surface of a metallic flat circular plate by etching while leaving a protrusion formation part and a method for removing the surface of a flat circular plate by sand blasting while leaving a protrusion formation part. The through hole 38 can be formed in advance before forming the protrusion 36. Alternatively, the through hole 38 can be formed after forming the protrusion 36. Alternatively, the through hole 38 can be formed at the same time when the jig base is molded.

As a material of the close-contact layer 31 disposed on the jig base 30, there can be mentioned for instance an elastomer of urethane series, acrylic series, fluoro-resin series, or silicone series, which is excellent for pliability, flexibility, heat resisting properties, elasticity, and stickiness. The addition agents of various kinds such as a reinforcing filler and hydrophobic silica can be added to the elastomer as needed.

It is preferable that the close-contact layer 31 is a flat plate in a shape almost equivalent to that of the jig base 30. It is preferable that an outside diameter of the close-contact layer 31 is almost equivalent to that of the jig base 30. It is preferable that a thickness of the close-contact layer 31 is in the range of 20 to 200 μm. In the case in which a thickness of the close-contact layer 31 is less than 20 μm, a mechanical durability to repeated suctions becomes less in some cases. On the other hand, in the case in which a thickness of the close-contact layer 31 exceeds 200 μm, it takes a long time for a detachment caused by suction disadvantageously.

It is preferable that the tensile break strength of the close-contact layer 31 is at least 5 MPa and a stretch at break of the close-contact layer 31 is at least 500%. In the case in which the tensile break strength and a stretch at break are in the above ranges, the close-contact layer 31 is not broken and not loosened, and the close-contact layer 31 can be restored to an original flat state even if a deformation of the close-contact layer 31 is repeated many times.

It is preferable that a modulus of elasticity in bending for the close-contact layer 31 is in the range of 10 to 100 MPa. In the case in which a modulus of elasticity in bending for the close-contact layer 31 is less than 10 MPa, a part other than a contact point of the close-contact layer 31 and the protrusion 36 undergoes a deflection due to gravity, whereby the close-contact layer 31 cannot adhere tightly to a chip in some cases. On the other hand, in the case in which a modulus of elasticity in bending for the close-contact layer 31 exceeds 100 MPa, a deformation caused by suction is hard to occur, and a chip cannot be easily detached in some cases.

It is preferable that a shearing force of a face on the side that comes into contract with a semiconductor wafer for the close-contact layer 31 is at least 35 N. In the present invention, a shearing force is a value that is measured between the close-contact layer 31 and a mirror face of a silicon wafer. The close-contact layer 31 is bonded to a well-known glass plate having a size of 30 mm long, 30 mm wide, and 3 mm thick, and the glass plate is disposed on a mirror wafer composed of silicon. In the case in which a load of 900 g is applied to the entire of a glass plate and the close-contact layer 31 for 5 seconds and the glass plate is pressed while applying a load in parallel to the mirror wafer, a load is measured when the glass plate starts to move.

Moreover, it is preferable that a contact force of the close-contact layer 31 is 2N/25 mm or less. In the case in which a contact force of the close-contact layer 31 exceeds 2N/25 mm, an adherence of the close-contact layer 31 and a chip disposed on the close-contact layer is too strong, thereby causing a blocking state. Consequently, a detachment of a chip due to suction may be impossible. A contact force in accordance with the present invention is peel strength in the case in which the close-contact layer 31 is bonded to a mirror face of a wafer and is detached.

The close-contact layer 31 can be formed by fabricating a film made of the above elastomer in advance based on a process such as a colander method, a pressing method, a coating method, and a printing method, and by bonding the elastomer film on the upper face of at least the sidewall 35 of the jig base 30. By this, the partitioned space 37 is formed. As a method for bonding the close-contact layer 31, there can be mentioned for instance a method for bonding the close-contact layer through an adhesive made of a resin such as an acrylic resin, a polyester resin, an epoxy resin, a silicone resin, and an elastomer resin, and a method for bonding the close-contact layer through a heat seal in the case in which the close-contact layer 31 has heat sealing characteristics.

A non-adhesive processing can be applied to the surface of the close-contact layer 31. In particular, it is preferable that a non-adhesive processing is applied to only the surface that comes into contact with a semiconductor chip in the case in which the close-contact layer 31 is deformed in a concave-convex shape for the close-contact layer on the protrusions 36. By this processing, a surface part to which a non-adhesive processing is not applied for the close-contact layer adheres tightly to a semiconductor chip before the close-contact layer 31 is deformed, and only the surface over the protrusions 36, that is, a non-adhesive convex surface comes into contact with a semiconductor chip in the case in which the close-contact layer 31 is deformed in a concave-convex shape. Consequently, a semiconductor chip can be further easily detached from the close-contact layer 31. As a non-adhesive processing method, there can be mentioned for instance a method for deforming the close-contact layer 31 in a concave-convex shape by suctioning an air in the partitioned space 37 using a vacuum apparatus and for physically roughening the end of the convex part using a grind stone roller or the like, an ultraviolet processing method, a method for laminating e non-adhesive rubber, and a method for coating a non-adhesive coating medium. For a surface roughness of a non-adhesive part, an arithmetic mean roughness Ra is preferably at least 1.6 μm, more preferably in the range of 1.6 to 12.5 μm, in the case in which a non-adhesive part is roughened based on a surface roughness in the above range, the close-contact layer 31 is not degraded, and a semiconductor chip can be easily detached from the close-contact layer 31.

In the present invention, the fixing jig 3 that has been formed as described above is prepared in advance.

[Adhesive Sheet]

Figure 3:
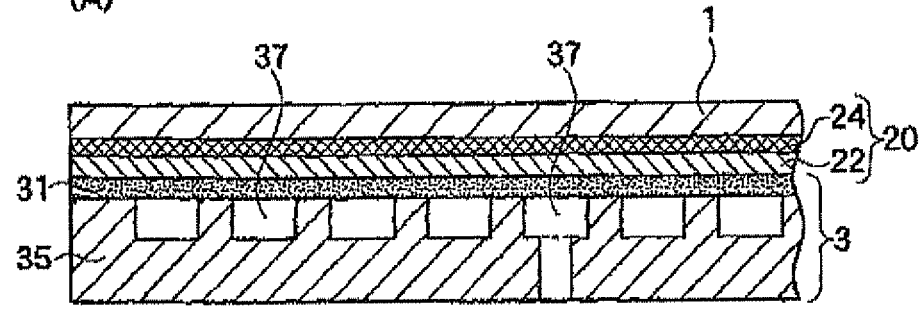
FIG. 3(A) is a schematic cross-sectional view showing a state of a step 1A of a first embodiment.
FIG. 3(B) is a schematic cross-sectional view showing a state of a step 1B of a first embodiment.
FIG. 3(C) is a schematic cross-sectional view showing a state of a step 1C of a first embodiment.
Figure 3:
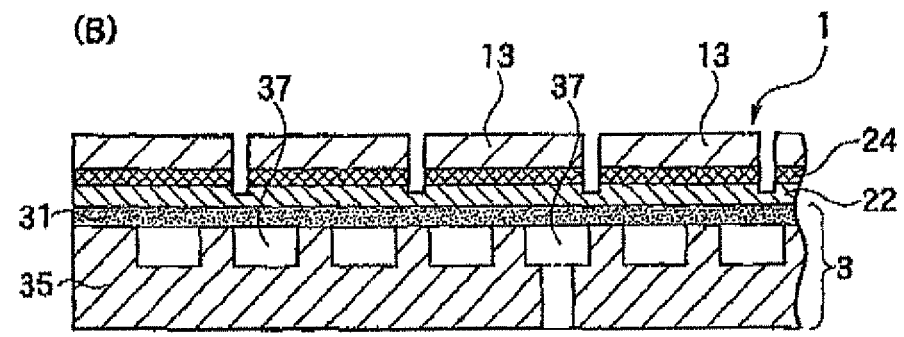
Figure 3:
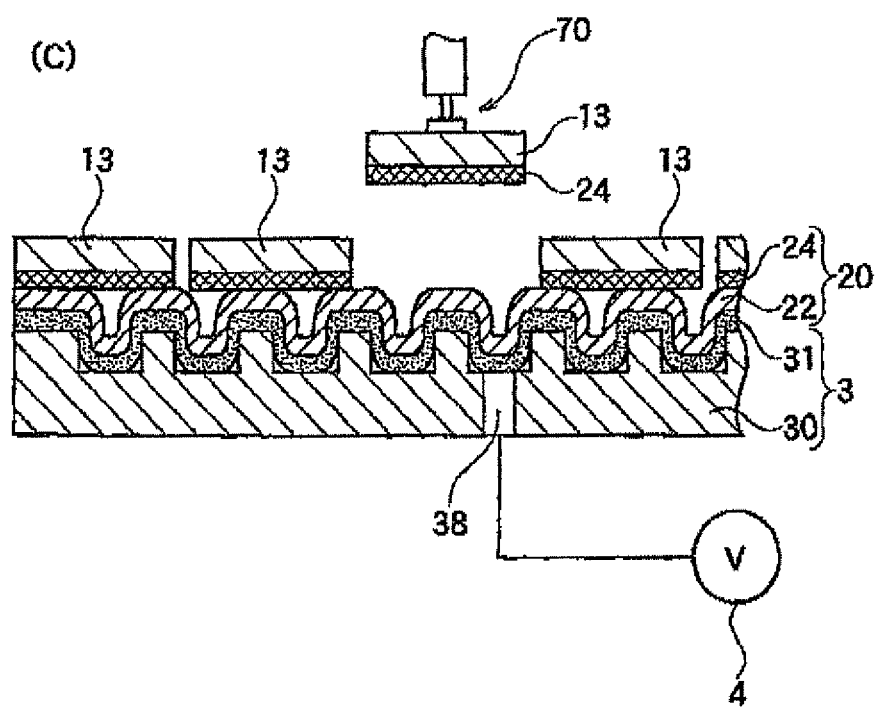

As shown in FIGS. 3(A) to 3(C), it is preferable that a die bonding adhesive layer 24 that is picked up together with a chip 13 for the last time is provided by an adhesive sheet 20. More specifically, the adhesive sheet 20 is provided with a layer configuration in which the die bonding adhesive layer 24 is detachably laminated on a release sheet 22 provided with a detachment layer made of silicone or the like. Another release sheet can also be laminated on the opposite surface of the die bonding adhesive layer 24 for the storage of the adhesive sheet 20 and the protection of an exposed surface.

The die bonding adhesive layer 24 is made of a thermosetting or thermoplastic resin composition. An application liquid made of the resin composition is coated on the release sheet 22 or another release sheet to form a layer and to produce the adhesive sheet 20.

As the die bonding adhesive layer 24 made of a thermosetting resin composition that is used for the present invention, a blended material of a binder resin and a thermosetting resin can be mentioned for instance.

As a binder resin that configures a thermosetting resin composition, there can be mentioned for instance an acrylic resin, a polyester resin, a polyvinyl ether resin, an urethane resin, and a polyamide resin. As a thermosetting resin, there can be used for instance an epoxy resin, an acrylic resin, a polyimide resin, a phenolic resin, an urea resin, a melamine resin, and a resorcinol resin, and an epoxy resin can be mentioned preferably. Moreover, a setting agent for setting a thermosetting resin can also be used. It is preferable that an ultraviolet curable resin such as urethane series acrylate oligomer is compounded to the die bonding adhesive layer 24 that has an sticky at normal temperature in order to control detachability with the release sheet 22. In the case in which an ultraviolet curable resin is compounded, the release sheet 22 closely adheres to the die bonding adhesive layer 24 before an irradiation of ultraviolet rays, and the release sheet 22 can be easily detached from the die bonding adhesive layer 24 after an irradiation of ultraviolet rays.

The die bonding adhesive layer 24 made of a thermosetting resin composition that is used for the present invention can be an sticky or a non-sticky at normal temperature. The die bonding adhesive layer 24 that has a sticky at normal temperature can be bonded at a room temperature or by heating processing at a comparatively low temperature as a temperature until a temporary bond in a die bonding, and there is a large difference from a condition in which the die bonding adhesive layer 24 is completely thermoset. Consequently, a temperature control can be easily carried out for the die bonding adhesive layer 24 of sticky type at normal temperature. For the die bonding adhesive layer 24 of non-sticky type at normal temperature, an involution of an air is difficult since a temporary bond is not completed at the moment of a die bonding. Typically, the die bonding adhesive layer 24 has a sticky in the case in which a binder resin that is used has a sticky, and the die bonding adhesive layer 24 has a non-sticky in the case in which a binder resin that is used has a non-sticky.

A thickness of the die bonding adhesive layer 24 is different depending on a shape of a surface of an object such as a wiring substrate that is bonded by a die bonding. However, a thickness of the die bonding adhesive layer 24 is 3 to 100 μm in an ordinary case, 10 to 50 μm preferably.

As the release sheet 22, there can be used for instance a comparatively soft film made of a resin such as a polyethylene film, a polypropylene film, a polybutene film, a polybutadiene film, a polymethyl pentene film, a polyvinyl chloride film, a vinyl W chloride copolymer film, a polyurethane film, an ethylene vinyl acetate film, an ionomer resin film, an ethylene (meta) acrylic acid copolymer film, an ethylene (meta) acrylic acid ester copolymer film, and a fluorine resin film, and a comparatively hard film made of a resin such as a polyethylene terephthalate film, a polyethylene naphthalate film, a polybutylene terephthalate film, a polystyrene film, a polycarbonate film, and a polyimide film.

As a film made of a resin that is used for the release sheet 22, a single layer film that is selected from the above films can be used, and a laminate film can also be used. Moreover, a crosslinked film thereof can also be used. In the case in which the release sheet 22 is laminated on an close-contact layer 31 of a fixing jig 3 to be used while the release sheet 22 is laminated on the die bonding adhesive layer 24, a comparatively soft film made of a resin is used in such a manner that the release sheet 22 is deformed similarly to the close-contact layer 31 by a suction. In the case in which the release sheet 22 is not laminated on the close-contact layer 31 of the fixing jig 3, a comparatively hard film made of a resin can be used.

In the purpose that the release sheet 22 become detachable from the die bonding adhesive layer 24, a surface that comes into contact with the die bonding adhesive layer 24 has a low surface tension. It is preferable that a surface tension is 40 mN/m or less for instance. A film made of a resin having a low surface tension can be obtained by selecting a material properly. In addition, a film made of a resin having a low surface tension can also be obtained by coating a release agent such as a silicone resin on a surface of a film made of a resin and by carrying out a release treating.

A thickness of the release sheet 22 is 10 to 500 μm in an ordinary case, 15 to 300 μm preferably, and 20 to 250 μm preferably in particular.

[Wafer]

Figure 4:
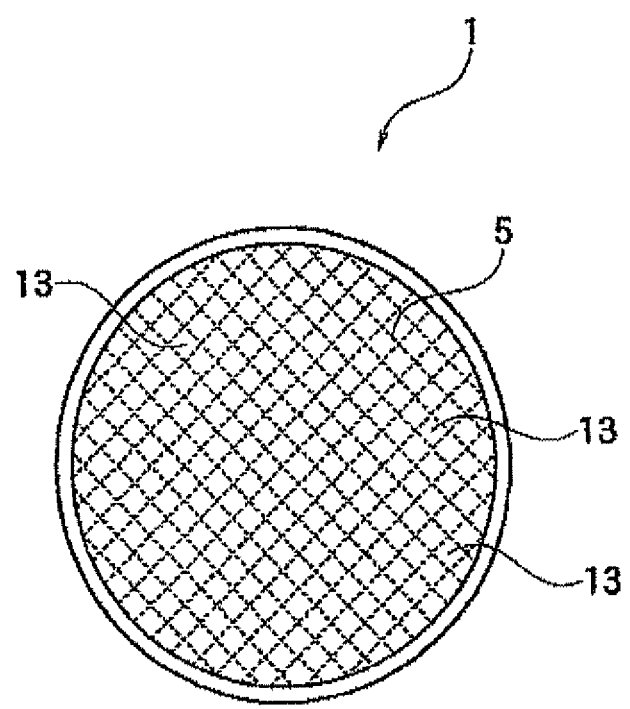
FIG. 4 is a schematic plan view showing a semiconductor wafer that is in a state before a dicing and that is used in the present invention.

As a wafer 1 that is used for the present invention, there can be mentioned for instance a semiconductor wafer made of silicon or a compound semiconductor, and a wafer made of an insulating material such as a glass and a ceramic. In the case in which a semiconductor wafer is used as the wafer 1, a water in the state in which a circuit is formed on the front surface side, the rear face side is ground, and a segmentation by a dicing is not yet carried out as shown in FIG. 4 is used. For the wafer 1, an extremely thin wafer having a thickness of 100 μm or less for instance is easily damaged even under its own weight. Consequently, the extremely thin wafer can receive the benefits brought about by the present invention in particular. In the present invention, a state of an aggregate of chips 13 that have been cut for each circuit while an outline form of a wafer before a dicing is held is called a wafer that has been segmented (a segmented wafer 80).

[Protective Pressure Sensitive Adhesive Sheet]

A protective pressure sensitive adhesive sheet 25 that is used in an embodiment in accordance with the present invention can be selected for a use as needed from the pressure sensitive adhesive tapes for grinding a wafer (a BG tape), which are commercially supplied by companies having ordinary skill in the art. More specifically, the protective pressure sensitive adhesive sheet 25 is a pressure sensitive adhesive sheet that is provided with a removable pressure-sensitive adhesive layer having an excellent removability such as ultraviolet curable type pressure sensitive adhesive layer on one face of a substrate of a film made of a resin for instance.

In the case in which the protective pressure sensitive adhesive sheet 25 is laminated between the close-contact layer 31 of the fixing jig 3 and the wafer 1 to be used, the protective pressure sensitive adhesive sheet 25 is made of a substrate of a comparatively soft film made of a resin in such a manner that the protective pressure sensitive adhesive sheet 25 is deformed by a suction similarly to the close-contact layer 31. In the case in which the protective pressure sensitive adhesive sheet 25 is not laminated on the close-contact layer 31 of the fixing jig 3, a comparatively hard film made of a resin can be used as a substrate.

[First Embodiment]

A first embodiment in accordance with the present invention is composed of a step of laminating a die bonding adhesive layer 24 and a wafer 1 on a close-contact layer 31 of a fixing jig 3 via a release sheet 22 (step 1A) as shown in FIG. 3(A), a step of completely cutting the wafer 1 and the die bonding adhesive layer 24 to form a chip 13 (step 1B) as shown in FIG. 3(B) (close-contact layer 31 of fixing jig 3—release sheet 22—die bonding adhesive layer 24—wafer 1 in this order), and a step of picking up the chip 13 together with the die bonding adhesive layer 24 from the fixing jig 3 by deforming the close-contact layer 31 of the fixing jig 3 (step 1C) as shown in FIG. 3(C).

Figure 5:
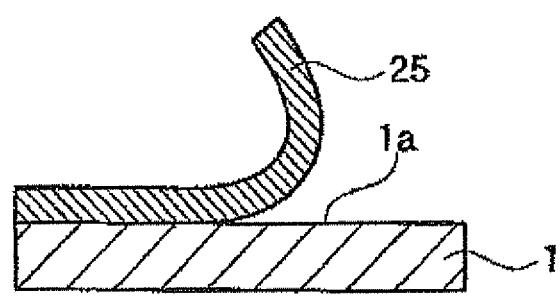
FIG. 5 is a schematic cross-sectional view showing a sticking step in which a protective pressure sensitive adhesive sheet is stuck to a wafer.
Figure 6:
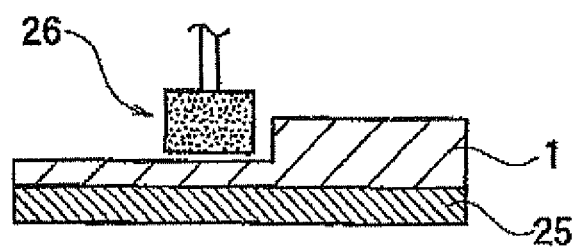
FIG. 6 is a schematic cross-sectional view showing a step of grinding the rear face of a wafer.
Figure 7:
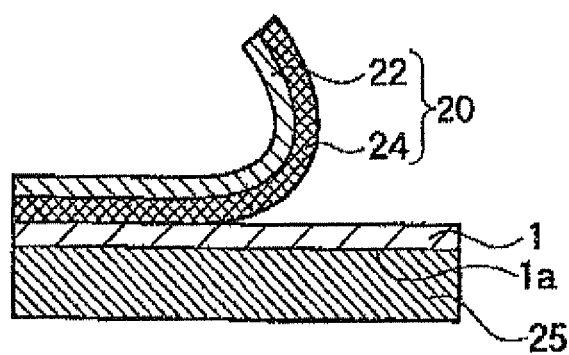
FIG. 7 is a schematic cross-sectional view showing a bonding step in which an adhesive sheet is bonded to a wafer.

For the wafer 1 that is supplied in the embodiment in accordance with the present invention, after a circuit is formed on the front surface of the wafer 1, the rear face is ground. In the case in which a step of grinding the rear face of the wafer is carried out, a protective pressure sensitive adhesive sheet 25 for protecting a circuit is bonded to a circuit side 1a of the wafer 1 as shown in FIG. 5, and the rear face of the wafer 1 is ground by a back grind apparatus 26 as shown in FIG. 6 to prepare the extremely thin wafer 1 having a thickness of approximately 50 μm for instance. Subsequently, the die bonding adhesive layer 24 side of an adhesive sheet 20 is laminated on a grinding surface of the wafer 1 as shown in FIG. 7, and the protective pressure sensitive adhesive sheet 25 is detached and removed from the circuit side 1a of the wafer 1. Moreover, the release sheet 22 side of the wafer 1 is then made come into contact with the close-contact layer 31 of the fixing jig 3 to implement a state of a laminating order in the step 1A as shown in FIG. 3(A).

Subsequently, as shown in FIG. 3(B), a step of completely cutting the wafer 1 and the die bonding adhesive layer 24 to form a chip 13 (step 1B) is carried out for forming the chip 13. The cutting process can be carried out by a normal blade dicing method and can be carried out by a laser dicing method. Each of the wafer 1 and the die bonding adhesive layer 24 can also be cut using a dedicated blade by a dual dicing method.

The wafer 1 that is fixed to the fixing jig 3 is mounted to a processing stage of a cutting apparatus such as a dicer in such a manner that the fixing jig 3 side is faced downward. In the case in which a configuration in which the wafer 1 is not suctioned via a through hole 38 of the fixing jig 3 to prevent the wafer 1 from being dropped out is not adopted, a cutting apparatus provided with a conventional processing stage having a normal wafer fixing means can be used without modification. In the case in which a processing stage is made of a porous material, a suction can be blocked off for a part that is abutted to the through hole 38. As described above, a step of cutting is carried out by a means and a method that are almost similar to conventional methods. Since the die bonding adhesive layer 24 and the close-contact layer 31 are laminated to each other via the release sheet 22, a cutting can be carried out to a layer of the release sheet 22. Consequently, a cutting speed can be increased while an accuracy of a cutting depth is degraded to improve productivity.

Subsequently, as shown in FIG. 3(C), a step of picking up the chip 13 together with the die bonding adhesive layer 24 from the fixing jig 3 by deforming the close-contact layer 31 of the fixing jig 3 (step 1C).

Figure 8:
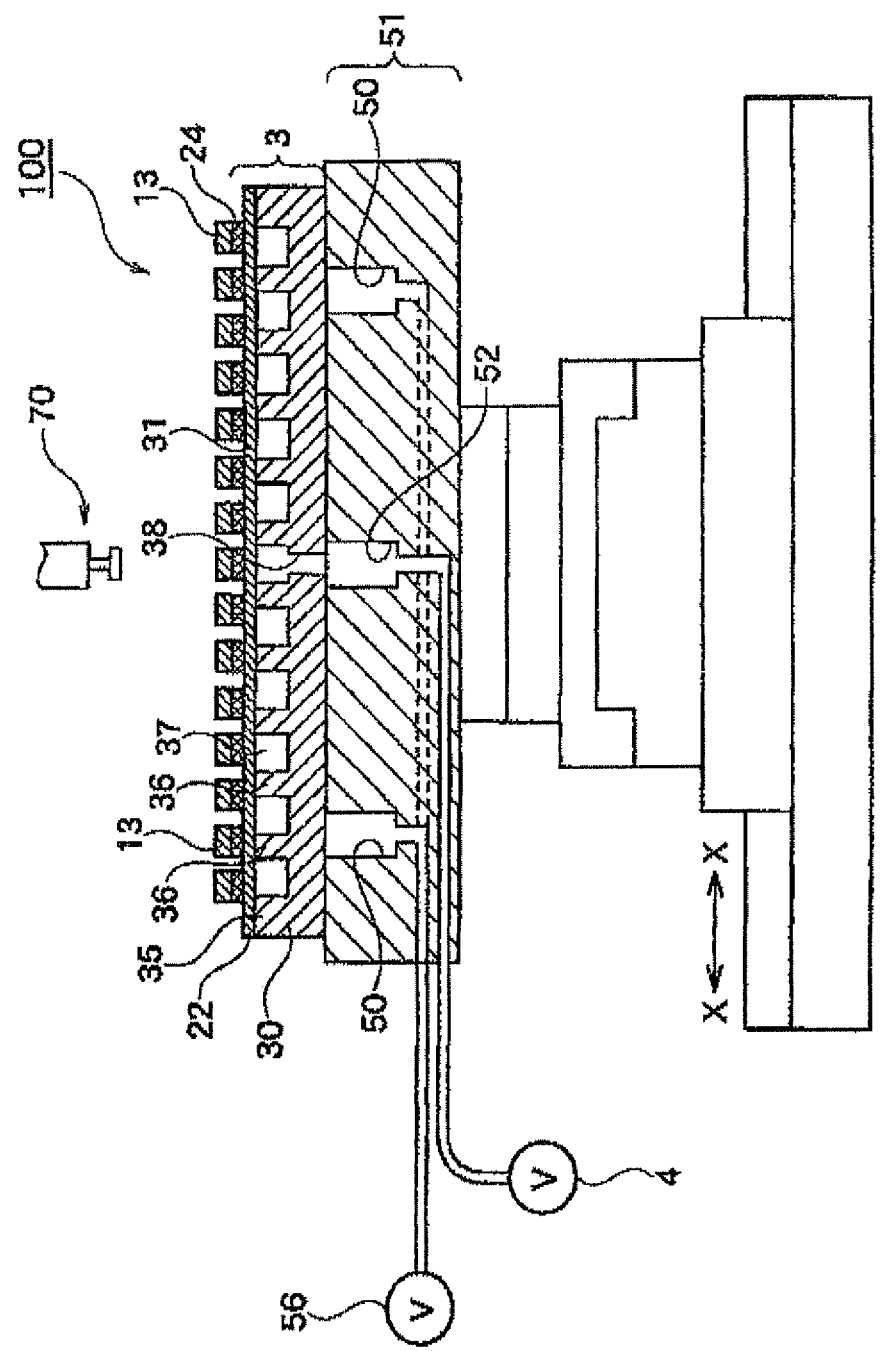
FIG. 8 is a schematic cross-sectional view showing a pickup apparatus that is used for a pickup.

The fixing jig 3 on which the chip 13 is fixed is transferred from the cutting apparatus to a pickup apparatus, and a pickup step (step 1C) is carried out For a pickup apparatus that is used for the embodiment in accordance with the present invention, a dedicated apparatus for handling the fixing jig 3 is used. More specifically, a pickup apparatus that is described in Japanese Patent Application No. 2006-283983 that has been filed by the applicant of the present invention is used. As shown in FIG. 8, a pickup apparatus 100 in accordance with the present application is provided with a table 51 for fixing the fixing jig 3 and a suction collet 70 for suctioning and holding the chip 13. The table 51 is provided with a suction part 50 that is opened for fixing the body of the fixing jig 3 and a suction part 52 that is opened for suctioning the partitioned space 37 that is connected to the through hole 38 of the fixing jig 3. The suction parts 50 and 52 are configured in such a manner that an independent suction for each part can be carried out.

Figure 9:
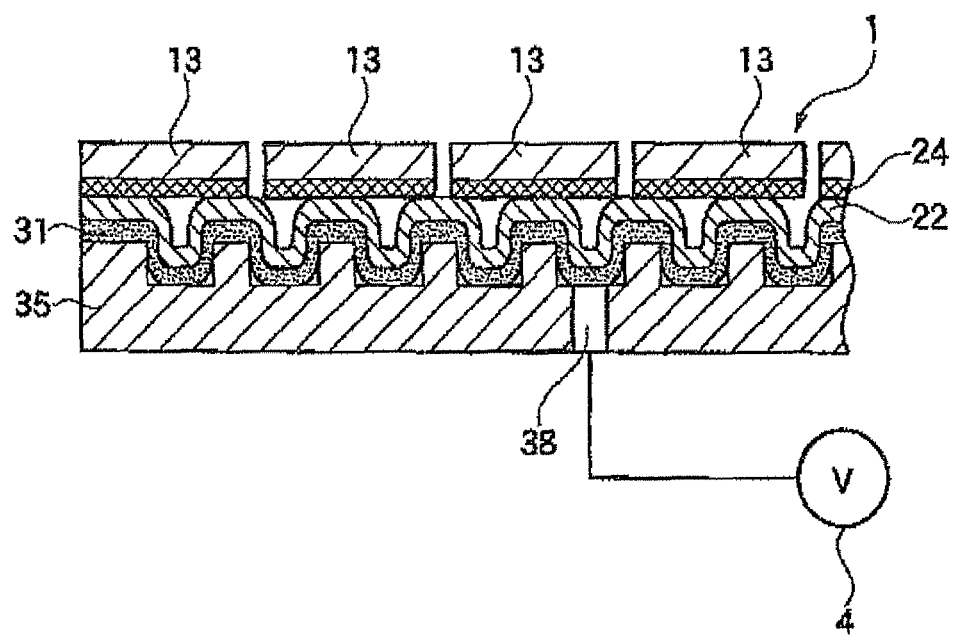
FIG. 9 is a schematic cross-sectional view showing a state in which a pickup is carried out on a fixing jig for a first embodiment in accordance with the present invention.

The fixing jig 3 is fixed to the table 51 of the pickup apparatus 100 in such a manner that the through hole 38 and the suction part 52 are corresponded to each other and the body of the fixing jig 3 is suctioned by the suction part 50. In the case in which a negative pressure is applied to the partitioned space 37 via the suction part 52 and the through hole 38 from a vacuum apparatus 4 or the like, the close-contact layer 31 is deformed toward the partitioned space 37 side. Since a comparatively soft film made of a resin is used as the release sheet 22, the release sheet 22 follows the deformation of the close-contact layer 31 as shown in FIG. 3(C). The die bonding adhesive layer 24 that is bonded to the chip 13 cannot be deformed. Consequently, an interfacial surface of the release sheet 22 and the die bonding adhesive layer 24 is detached in a state in which the release sheet 22 and the die bonding adhesive layer 24 adhere to each other by a point contact at only a position of a protrusion 36 as shown in FIG. 9.

Even in the case in which the pickup is progressed and an area rate in which the chip 13 exists on the fixing jig 3 is changed greatly, a force for holding the chip 13 is proportional to an area of the close-contact layer 31 with which the chip 13 comes into contact. The area of the close-contact layer 31 that adheres to each chip 13 by a point contact is not varied as a pickup is progressed. Consequently, the force for holding the chip 13 is constant until the end.

After that, the suction collet 70 is moved to a position of a prescribed chip 13 and is faced to a surface of the chip. A negative pressure is then applied to the suction collet 70, and the suction collet 70 suctions and holds (picks up) the chip 13 in a state in which the die bonding adhesive layer 24 is laminated on the chip 13. The chip 13 that has been picked up can be directly die-bonded to a circuit substrate such as a lead frame. Moreover, while the chip 13 is held on a chip carrier means such as a die sort tape, the chip 13 can also be transferred in a storage state to carry out a die bonding.

In the above described embodiment, the fixing jig 3 and the die bonding adhesive layer 24 are laminated to each other via the release sheet 22. However, the die bonding adhesive layer 24 and the fixing jig 3 can also be directly laminated to each other without disposing the release sheet 22 between the die bonding adhesive layer 24 and the fixing jig 3. In this case, after the adhesive sheet 20 is bonded to the wafer 1, the release sheet 22 can be detached. In this case, a dicing is carried out precisely in such a manner that a cutting depth in a dicing is a position of an interfacial surface of the wafer 1 and the close-contact layer 31.

In the above described embodiment, the protective pressure sensitive adhesive sheet 25 is detached in a mid course of the step, and a cutting is carried out while the circuit side 1a of the wafer 1 is exposed. However, the protective pressure sensitive adhesive sheet 25 is not detached in a mid course of the step, and the protective pressure sensitive adhesive sheet 25 can be detached before or after a pickup step or after a die bonding. In this case, the protective pressure sensitive adhesive sheet 25 is cut together with the wafer 1 and die bonding adhesive layer 24 in a cutting step, and the circuit side 1a of the wafer 1 can be prevented from being damaged by a grinding dust or a broken piece in the case in which a blade is damaged. The protective pressure sensitive adhesive sheet 25 that has been cut can be detached by separately using a pressure sensitive adhesive tape for removing.

Moreover, in the above described embodiment, the die bonding adhesive layer 24 is disposed on a grinding rear face of the wafer 1. However, the die bonding adhesive layer 24 can also be bonded to the circuit side 1a of the wafer 1. In this case, for the die bonding step, a flip chip bonding method in which a circuit substrate and the circuit side of the chip 13 are faced to each other is used, and the die bonding adhesive layer 24 plays a role as an underfill material.

Moreover, in the above described embodiment, after the die bonding adhesive layer 24 is bonded to the wafer 1 side in advance, the wafer 1 is laminated on the fixing jig 3. However, after the die bonding adhesive layer 24 is laminated on the fixing jig 3 in advance, the wafer 1 can also be laminated on the surface of the die bonding adhesive layer 24.

[Second Embodiment]

A second embodiment in accordance with the present invention will be described in the following.

Figure 10:
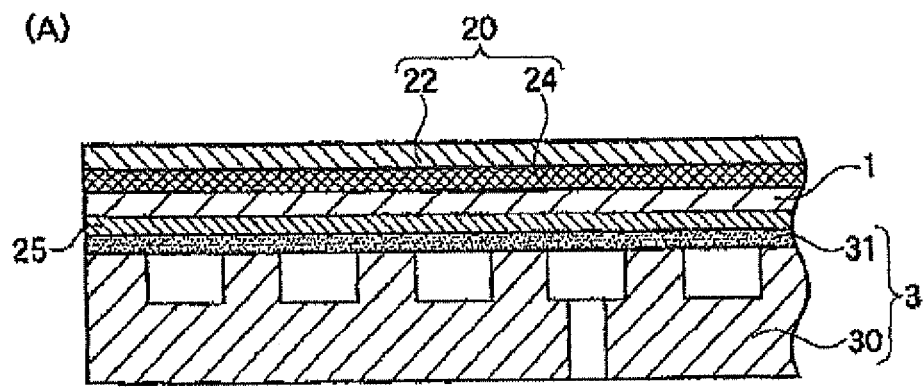
FIG. 10(A) is a schematic cross-sectional view showing a state of a step 2A of a second embodiment.
FIG. 10(B) is a schematic cross-sectional view showing a state of a step 2B of a second embodiment.
FIG. 10(C) is a schematic cross-sectional view showing a state of a step 2C of a second embodiment.
Figure 10:
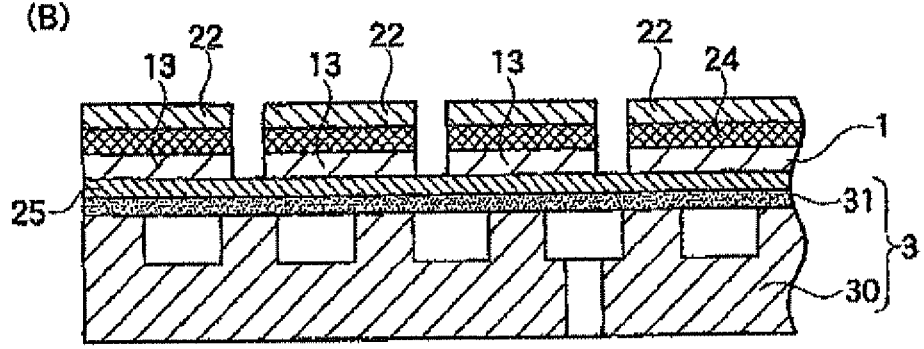
Figure 10:
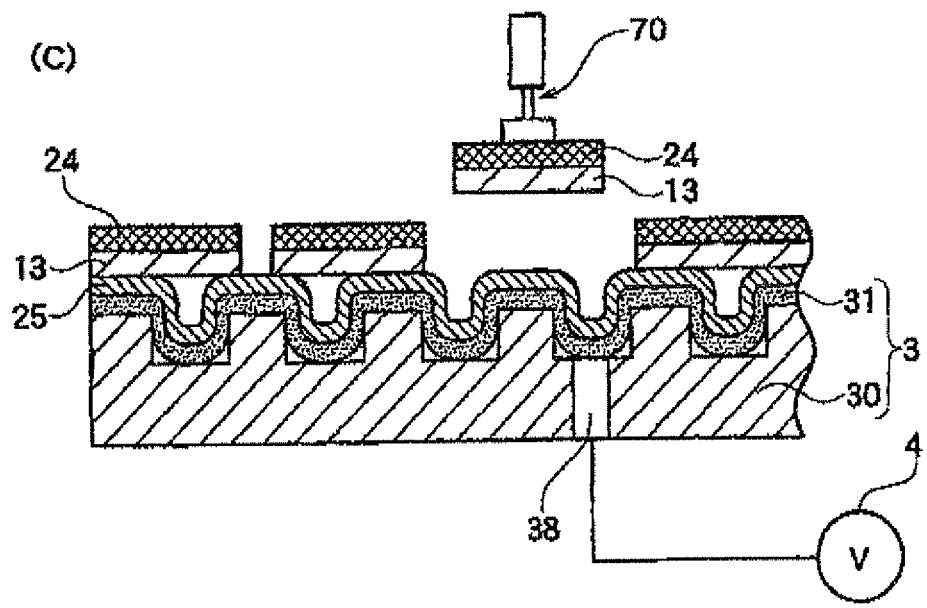

A second embodiment in accordance with the present invention is composed of a step of laminating a wafer 1 and a die bonding adhesive layer 24 on an close-contact layer 31 of a fixing jig 3 via a protective pressure sensitive adhesive sheet 25 (step 2A) as shown in FIG. 10(A), a step of completely cutting the wafer 1 and the die bonding adhesive layer 24 to form a chip 13 (step 2B) as shown in FIG. 10(B) (close-contact layer 31 of fixing jig 3—release sheet 22—wafer—die bonding adhesive layer 24 in this order), and a step of picking up the chip 13 together with the die bonding adhesive layer 24 from the fixing jig 3 by deforming the close-contact layer 31 of the fixing jig 3 (step 2C) as shown in FIG. 10(C).

In the second embodiment, by a method similar to that of the first embodiment, an extremely thin wafer 1 that has been ground using a protective pressure sensitive adhesive sheet 25 is prepared, and an adhesive sheet 20 is bonded to a ground rear face of the wafer 1. Subsequently, the side of the protective pressure sensitive adhesive sheet 25 that has been bonded to a circuit side 1a of the wafer 1 is then made come into contact with the close-contact layer 31 of the fixing jig 3 to implement a state of a laminating order in the step 2A as shown in FIG. 10(A). The release sheet 22 of the adhesive sheet 20 is not detached.

Subsequently, a step of completely cutting the wafer 1 and the die bonding adhesive layer 24 to form a chip 13 (step 2B) is carried out for forming the chip 13. The cutting process in accordance with the second embodiment can be carried out by the cutting means and cutting method of the first embodiment without modification. Since the release sheet 22 has been laminated on the die bonding adhesive layer 24, the release sheet 22 is also cut together with the die bonding adhesive layer 24. The release sheet 22 plays a role of protecting the die bonding adhesive layer 24 from a contamination caused by a cutting dust or the like in the cutting step.

Since the wafer 1 and the close-contact layer 31 are laminated to each other via the protective pressure sensitive adhesive sheet 25, a cutting can be carried out into a layer of the protective pressure sensitive adhesive sheet 25. Consequently, a cutting speed can be increased while an accuracy of a cutting depth is degraded to improve productivity. After the cutting step is completed, the release sheet 22 on the die bonding adhesive layer 24 is detached and removed by using a pressure sensitive adhesive tape for a removing.

Subsequently, a step of picking up the chip 13 together with the die bonding adhesive layer 24 from the fixing jig 3 by deforming the close-contact layer 31 of the fixing jig 3 (step 2C). An apparatus that is similar to the apparatus of the first embodiment can be used as a pickup apparatus that is used for the second embodiment.

The fixing jig 3 is fixed to the table 51 of the pickup apparatus 100 in such a manner that the through hole 38 and the suction part 52 are corresponded to each other and the body of the fixing jig 3 is suctioned by the suction part 50. In the case in which a negative pressure is applied to the partitioned space 37 via the suction part 52 and the through hole 38 from a vacuum apparatus 4 or the like, the close-contact layer 31 is deformed toward the partitioned space 37 side. Since a generally soft film made of a resin is used as a material of the protective pressure sensitive adhesive sheet 25, the protective pressure sensitive adhesive sheet 25 follows the deformation of the close-contact layer 31. The chip 13 itself cannot be deformed. Consequently, the protective pressure sensitive adhesive sheet 25 is detached in a state in which the protective pressure sensitive adhesive sheet 25 adheres to the chip 13 by a point contact at only a position of a protrusion 36 as shown in FIG. 10(C).

After that, the suction collet 70 is moved to a position of a prescribed chip and is faced to a surface of the die bonding adhesive layer 24 on the chip. A negative pressure is then applied to the suction collet 70, and the suction collet 70 suctions and holds (picks up) the chip 13 in a state in which the die bonding adhesive layer 24 is laminated on the chip 13.

The chip 13 that has been picked up can be directly die-bonded to a circuit substrate such as a lead frame. Moreover, while the chip 13 is held on a chip carrier means such as a die sort tape, the chip 13 can also be transferred in a storage state to carry out a die bonding.

In the above described second embodiment, the fixing jig 3 and the wafer 1 are laminated to each other via the protective pressure sensitive adhesive sheet 25. However, the wafer 1 and the fixing jig 3 can also be directly laminated to each other without disposing the protective pressure sensitive adhesive sheet 25 between the wafer 1 and the fixing jig 3. In this case, after the adhesive sheet 20 is bonded to the wafer 1, the protective pressure sensitive adhesive sheet 25 can be removed. In this case, a dicing is carried out precisely in such a manner that a cutting depth in a dicing is a position of an interfacial surface of the wafer 1 and the close-contact layer 31. Moreover, in the above described second embodiment, the release sheet 22 is removed after the cutting step. However, the release sheet 22 can also be detached before a lamination on the fixing jig 3, before the cutting step, or after the pickup step.

Moreover, in the above described second embodiment, the die bonding adhesive layer 24 is disposed on a grinding rear face of the wafer 1. However, the die bonding adhesive layer 24 can also be bonded to the circuit side of the wafer 1. In this case, for the die bonding step, a flip chip bonding method in which a circuit substrate and the circuit side of the chip 13 are faced to each other is used, and the die bonding adhesive layer 24 plays a role as an underfill material.

Moreover, in the above described second embodiment, after the adhesive sheet 20 is bonded to the wafer 1 side in advance, the wafer 1 is laminated on the fixing jig 3. However, after the wafer 1 is laminated on, the fixing jig 3 in advance, the wafer 1 can also be laminated on the die bonding adhesive layer 24 of the adhesive sheet 20.

[Third Embodiment]

A third embodiment in accordance with the present invention will be described in the following.

Figure 11:
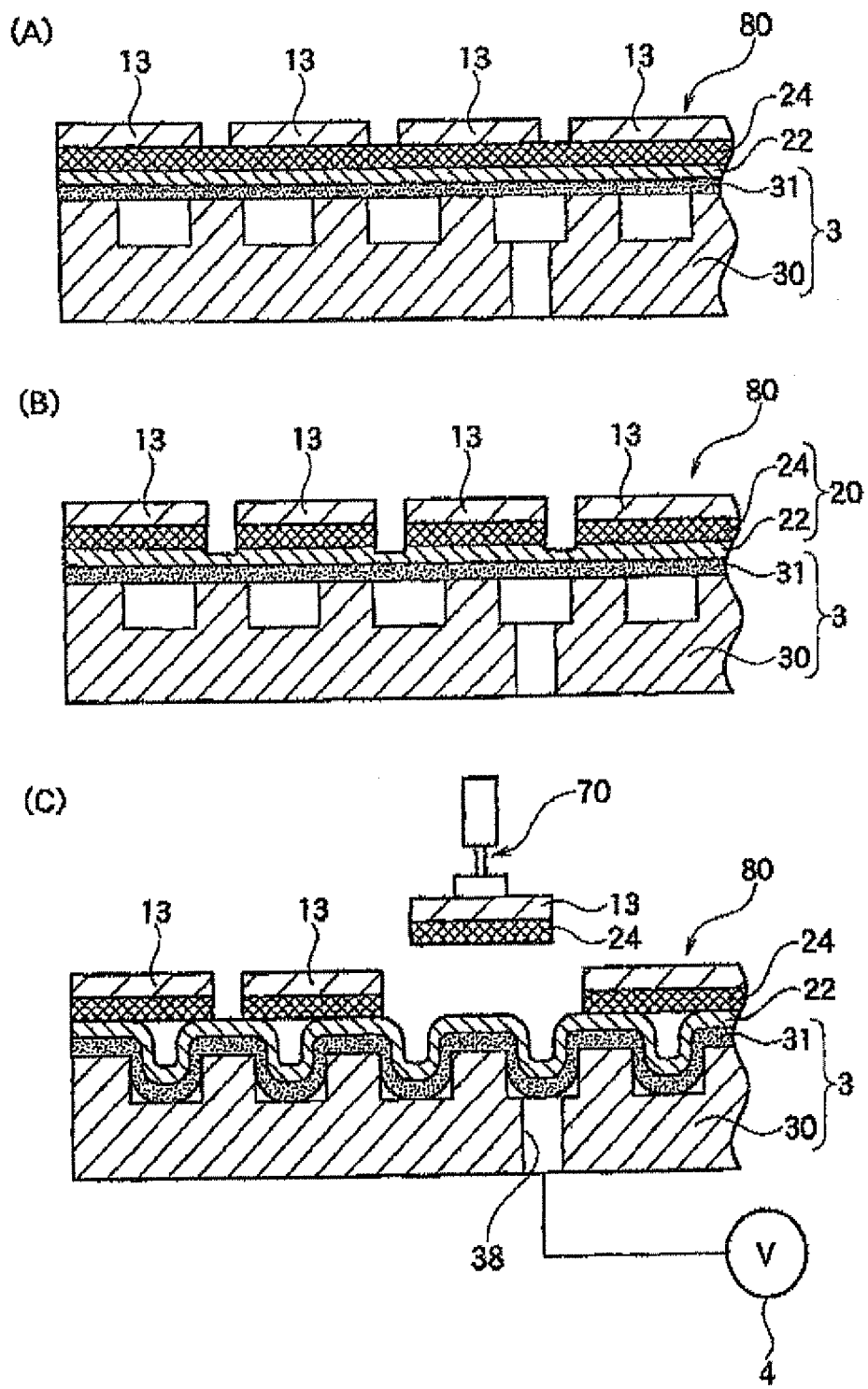
FIG. 11(A) is a schematic cross-sectional view showing a state of a step 3A of a third embodiment.
FIG. 11(B) is a schematic cross-sectional view showing a state of a step 3B of a third embodiment.
FIG. 11(C) is a schematic cross-sectional view showing a state of a step 3C of a third embodiment.

A third embodiment in accordance with the present invention is composed of a step of laminating a die bonding adhesive layer 24 and a segmented wafer 80 on an close-contact layer 31 of a fixing jig 3 via a release sheet 22 (step 3A) as shown in FIG. 11(A), a step of completely cutting the die bonding adhesive layer 24 with the shape of the chip (step 3B) as shown in FIG. 11(B) (close-contact layer 31 of fixing jig 3—release sheet 22—die bonding adhesive layer 24—segmented wafer 80 in this order), and a step of picking up the chip 13 together with the die bonding adhesive layer 24 from the fixing jig by deforming the close-contact layer 31 of the fixing jig 3 (step 3C) as shown in FIG. 11(C).

The segmented wafer 80 that is supplied in the embodiment in accordance with the present invention is obtained by a pre dicing method. More specifically, a half-cutting dicing of a depth larger than a targeted thickness of a chip is carried out for a circuit face side of the wafer 1, the protective pressure sensitive adhesive sheet 25 is attached to the surface of the circuit, and the rear face side of the wafer is ground up to a targeted thickness in order to carry out a thinning and a segmentation of the wafer 1 simultaneously. For the chip that can be obtained by the pre dicing method, a chip crack is hard to occur, and the transverse rupture strength of the chip is larger than that of a chip that is obtained by a normal method. Consequently, a semiconductor device having higher reliability can be obtained.

Figure 12:
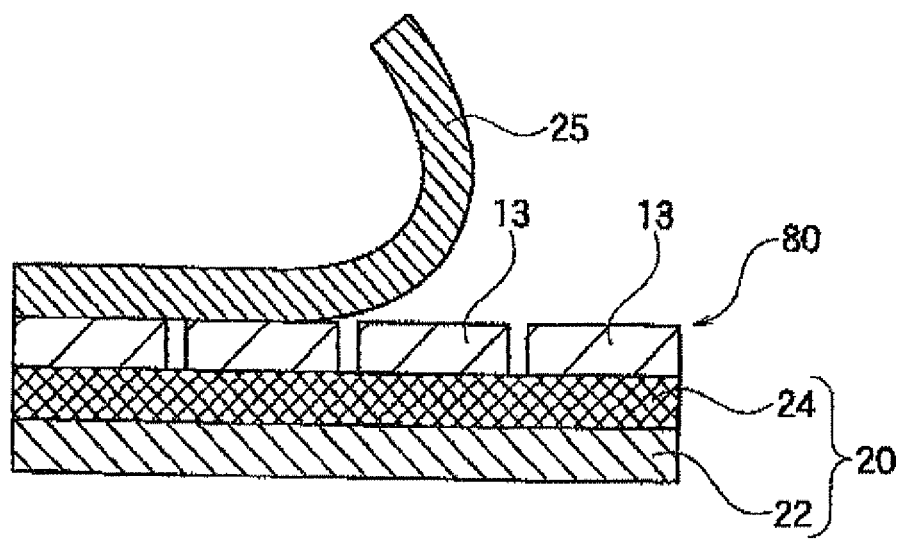
FIG. 12 is a schematic cross-sectional view showing a detachment step in which a protective pressure sensitive adhesive sheet is detached from a wafer.

Subsequently, the die bonding adhesive layer 24 side of an adhesive sheet 20 is laminated on a grinding rear face of the segmented wafer 80. Moreover, the release sheet 22 side of the adhesive sheet 20 is then made come into contact with the close-contact layer 31 of the fixing jig 3. As shown in FIG. 12, the protective pressure sensitive adhesive sheet 25 is detached and removed from the circuit side of the wafer 80 to implement a state of a laminating order in the step 3A as shown in FIG. 11(A).

Subsequently, a step of completely cutting the die bonding adhesive layer 24 along the shape of each segmented chip (step 3B) is carried out. The cutting process can be carried out by a normal blade dicing method and can be carried out by a laser dicing method. Since the die bonding adhesive layer 24 and the close-contact layer 31 are laminated to each other via the release sheet 22, a cutting can be carried out into a layer of the release sheet 22. Consequently, a cutting speed can be increased while an accuracy of a cutting depth is degraded to improve productivity.

Subsequently, a step of picking up the chip 13 together with the die bonding adhesive layer 24 from the fixing jig 3 by deforming the close-contact layer 31 of the fixing jig 3 (step 3C). An apparatus that is similar to the apparatus of the first embodiment can be used as a pickup apparatus that is used for the third embodiment.

The fixing jig 3 is fixed to the table 51 of the pickup apparatus 100 in such a manner that the through hole 38 and the suction part 52 are corresponded to each other and the body of the fixing jig 3 is suctioned by the suction part 50. In the case in which a negative pressure is applied to the partitioned space 37 via the suction part 52 and the through hole 38 from a vacuum apparatus 4 or the like, the close-contact layer 31 is deformed toward the partitioned space side. Since a comparatively soft film made of a resin is used as the release sheet 22, the release sheet 22 follows the deformation of the close-contact layer 31. The die bonding adhesive layer 24 that is bonded to the chip 13 cannot be deformed. Consequently, an interfacial surface of the release sheet 22 and the die bonding adhesive layer 24 is detached in a state in which the release sheet 22 and the die bonding adhesive layer 24 adhere to each other by a point contact at only a position of a protrusion 36 as shown in FIG. 11(C).

After that, the suction collet 70 is moved to a position of a prescribed chip and is faced to a surface of the chip. A negative pressure is then applied to the suction collet 70, and the suction collet 70 suctions and holds (picks up) the chip 13 in a state in which the die bonding adhesive layer 24 is laminated on the chip 13.

The chip 13 that has been picked up can be directly die-bonded to a circuit substrate such as a lead frame. Moreover, while the chip 13 is held on a chip carrier means such as a die sort tape, the chip 13 can also be transferred in a storage state to carry out a die bonding.

In the above described third embodiment, the segmented wafer 80 is prepared by a pre dicing method. However, a segmented wafer that is prepared by other methods can also be used. More specifically, the protective pressure sensitive adhesive sheet 25 is attached to the circuit side of the wafer 1, and the rear face side of the wafer is ground. Subsequently, the protective pressure sensitive adhesive sheet 25 side is fixed, and a dicing is carried out from a ground surface side of the wafer 1. Subsequently, the die bonding adhesive layer 24 side of an adhesive sheet 20 is bonded to a ground rear face of the segmented wafer 80. Moreover, the release sheet 22 side of the adhesive sheet 20 is then made come into contact with the close-contact layer 31 of the fixing jig 3. The protective pressure sensitive adhesive sheet 25 is then detached and removed from the circuit side of the wafer 80 to implement a state of a laminating order of the third embodiment.

In the above described third embodiment, the fixing jig 3 and the die bonding adhesive layer 24 are laminated to each other via the release sheet 22. However, the die bonding adhesive layer 24 and the fixing jig 3 can also be directly laminated to each other without disposing the release sheet 22 between the die bonding adhesive layer 24 and the fixing jig 3. In this case, after the adhesive sheet 20 is bonded to the wafer 1, the release sheet 22 can be removed. In this case, a dicing is carried out precisely in such a manner that a cutting depth in a dicing is a position of an interfacial surface of the die bonding adhesive layer 24 and the close-contact layer 31.

In the above described third embodiment, the protective pressure sensitive adhesive sheet 25 is detached after the wafer 1 is laminated on the fixing jig 3. However, the protective pressure sensitive adhesive sheet 25 can also be detached after the adhesive sheet 20 is bonded to the wafer 1, or before or after a die bonding is carried out after the cutting step is completed. In the case in which the protective pressure sensitive adhesive sheet 25 is removed after the cutting step is completed, the protective pressure sensitive adhesive sheet 25 is cut together with die bonding adhesive layer 24 in the cutting step, and the circuit side of the chip 13 can be prevented from being damaged by a grinding dust or a broken piece in the case in which a blade is damaged. The protective pressure sensitive adhesive sheet 25 that has been cut can be removed by separately using a pressure sensitive adhesive tape for a detachment.

Moreover, in the above described third embodiment, the die bonding adhesive layer 24 is disposed on a ground rear face of the segmented wafer 80. However, the die bonding adhesive layer 24 can also be bonded to the circuit side of the segmented wafer 80. In this case, for the die bonding step, a flip chip bonding method in which a circuit substrate and the circuit side of the chip 13 are faced to each other is used, and the die bonding adhesive layer 24 plays a role as an underfill material.

Moreover, in the above described third embodiment, after the die bonding adhesive layer 24 is bonded to the segmented wafer 80 side in advance, the segmented wafer 80 is laminated on the fixing jig 3. However, after the die bonding adhesive layer 24 is laminated on the fixing jig 3 in advance, the segmented wafer 80 can also be laminated on the surface of the die bonding adhesive layer 24.

[Fourth Embodiment]

A fourth embodiment in accordance with the present invention will be described in the following.

Figure 13:
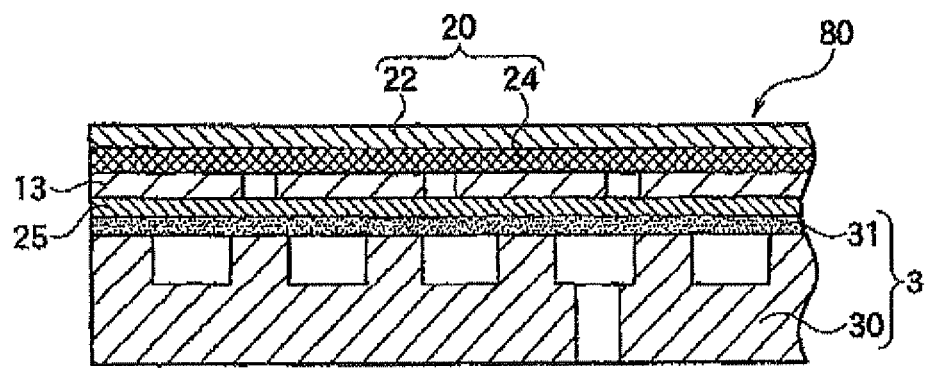
FIG. 13(A) is a schematic cross-sectional view showing a state of a step 4A of a fourth embodiment.
FIG. 13(B) is a schematic cross-sectional view showing a state of a step 4B of a fourth embodiment.
FIG. 13(C) is a schematic cross-sectional view showing a state of a step 4C of a fourth embodiment.
Figure 13:
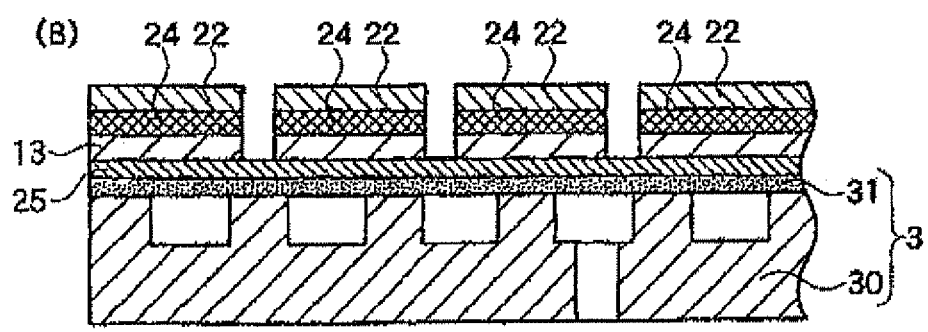
Figure 13:
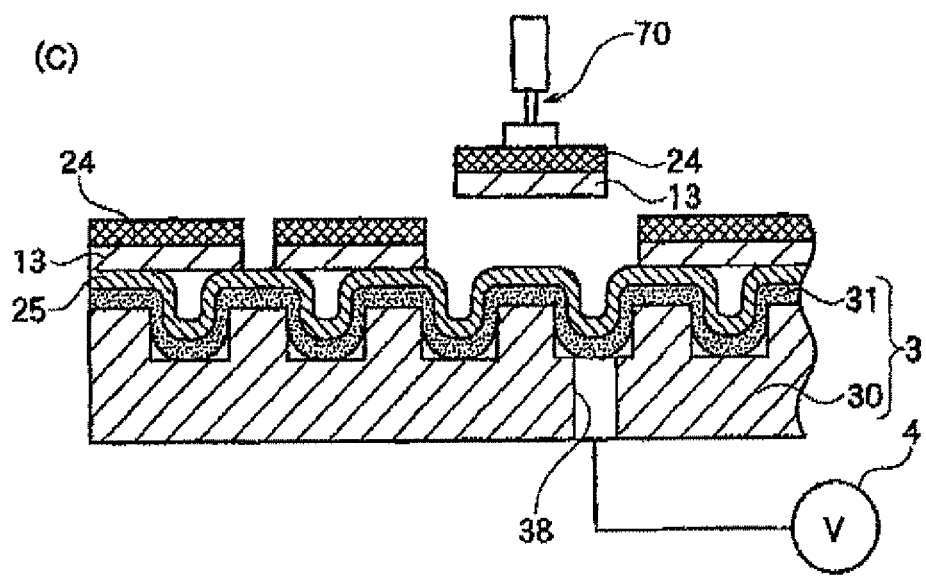

A fourth embodiment in accordance with the present invention is composed of a step of laminating a segmented wafer 80 and a die bonding adhesive layer 24 on an close-contact layer 31 of a fixing jig 3 via a protective pressure sensitive adhesive sheet 25 (step 4A) as shown in FIG. 13(A), a step of completely cutting the die bonding adhesive layer 24 with the shape of the chip (step 4B) as shown in FIG. 13(B) (close-contact layer 31 of fixing jig 3—protective pressure sensitive adhesive sheet 25—segmented wafer 80—die bonding adhesive layer 24 in this order), and a step of picking up the chip 13 together with the die bonding adhesive layer 24 from the fixing jig by deforming the close-contact layer 31 of the fixing jig 3 (step 4C) as shown in FIG. 13(C).

The segmented wafer 80 that is supplied in the embodiment in accordance with the present invention is obtained similarly to the third embodiment, preferably by a pre dicing method. Subsequently, the die bonding adhesive layer 24 side of an adhesive sheet 20 is bonded to a grinding rear face of the segmented wafer 80. Moreover, the protective pressure sensitive adhesive sheet 25 on the segmented wafer 80 is then made come into contact with the close-contact layer 31 of the fixing jig 3 to implement a state of a laminating order in the step 4A as shown in FIG. 13(A).

Subsequently, a step of completely cutting the die bonding adhesive layer 24 along the shape of each segmented chip (step 4B) is carried out. The cutting process can be carried out by a normal blade dicing method and can be carried out by a laser dicing method. Since the release sheet 22 has been laminated on the die bonding adhesive layer 24, the release sheet 22 is also cut together with the die bonding adhesive layer 24. The release sheet 22 plays a role of protecting the die bonding adhesive layer 24 from a contamination caused by a cutting dust or the like in the cutting step. After the cutting step is completed, the release sheet 22 on the die bonding adhesive layer 24 is detached and removed by using a pressure sensitive adhesive tape for removing.

Subsequently, a step of picking up the chip 13 together with the die bonding adhesive layer 24 from the fixing jig 3 by deforming the close-contact layer 31 of the fixing jig 3 (step 4C). An apparatus that is similar to the apparatus of the first embodiment can be used as a pickup apparatus that is used for the fourth embodiment.

The fixing jig 3 is fixed to the table 51 of the pickup apparatus 100 in such a manner that the through hole 38 and the suction part are corresponded to each other and the body of the fixing jig 3 is suctioned by the suction part 50. In the case in which a negative pressure is applied to the partitioned space 37 via the suction part 52 and the through hole 38 from a vacuum apparatus 4 or the like, the close-contact layer 31 is deformed toward the partitioned space 37 side. Since a generally soft film made of a resin is used as a material of the protective pressure sensitive adhesive sheet 25, the protective pressure sensitive adhesive sheet 25 follows the deformation of the close-contact layer 31. The chip 13 itself cannot be deformed. Consequently, the protective pressure sensitive adhesive sheet 25 is detached in a state in which the protective pressure sensitive adhesive sheet 25 adheres to the chip 13 by a point contact at only a position of a protrusion 36 as shown in FIG. 13(C).

After that, the suction collet 70 is moved to a position of a prescribed chip and is faced to a surface of the die bonding adhesive layer 24 on the chip. A negative pressure is then applied to the suction collet 70, and the suction collet 70 suctions and holds (picks up) the chip 13 in a state in which the die bonding adhesive layer 24 is laminated on the chip 13.

The chip 13 that has been picked up can be directly die-bonded to a circuit substrate such as a lead frame. Moreover, while the chip 13 is held on a chip carrier means such as a die sort tape, the chip 13 can also be transferred in a storage state to carry out a die bonding.

In the above described fourth embodiment, the fixing jig 3 and the die bonding adhesive layer 24 are laminated to each other via the protective pressure sensitive adhesive sheet 25. However, the die bonding adhesive layer 24 and the fixing jig 3 can also be directly laminated to each other without disposing the protective pressure sensitive adhesive sheet 25 between the die bonding adhesive layer 24 and the fixing jig 3. In this case, after the adhesive sheet 20 is bonded to the segmented wafer 80, the protective pressure sensitive adhesive sheet 25 can be removed. Moreover, in the above described fourth embodiment, the release sheet 22 is detached after the cutting step is completed. However, the release sheet 22 can also be removed after the adhesive sheet 20 is bonded to the segmented wafer 80, or before or after a die bonding is carried out after the cutting step is completed.

Moreover, in the above described fourth embodiment, the die bonding adhesive layer 24 is disposed on a ground rear face of the segmented wafer 80. However, the die bonding adhesive layer 24 can also be bonded to the circuit side of the segmented wafer 80. In this case, for the die bonding step, a flip chip bonding method in which a circuit substrate and the circuit side of the chip 13 are faced to each other is used, and the die bonding adhesive layer 24 plays a role as an underfill material.

Moreover, in the above described fourth embodiment, after the die bonding adhesive layer 24 is bonded to the segmented wafer 80 side in advance, the segmented wafer 80 is laminated on the fixing jig. However, after the die bonding adhesive layer 24 is laminated on the fixing jig 3 in advance, the segmented wafer 80 can also be laminated on the surface of the die bonding adhesive layer 24.

In any embodiment in accordance with the present invention, the chip 13 can be picked up by only the suction force of the suction collet 70 without the pushing up of the chip using a fine needle. Consequently, a damage caused by the pushing up of the chip using a fine needle can be prevented for the chip. Moreover, even in the case in which chips 13 are picked up continuously, an contact state with a chip 13 that remains on the fixing jig 3 does not vary. Therefore, an operation for adjusting a suction force for preventing a displacement of the chip 13 is not required in the later step of the pickup. Consequently, even for the chip 13 that has been processed to be extremely thin, the chip 13 with an adhesive applied can be picked up, and the chip 13 can be transferred to the die bonding step in safety.

The invention claimed is:

1. A method for producing a chip with an adhesive applied, the method comprising:
   providing a fixing jig comprising a close-contact layer and a jig base, the jig base having a plurality of protrusions on one side and a sidewall having a height substantially equivalent to that of the protrusion at the outer circumference section of the one side;
   laminating a die bonding adhesive layer and a wafer on the close-contact layer of the fixing jig;
   forming a chip by completely cutting the wafer and the die bonding adhesive layer; and
   picking up the chip together with the die bonding adhesive layer from the fixing jig by deforming the close-contact layer of the fixing jig,
   wherein:
   the close-contact layer is laminated on the surface of the jig base provided with the protrusions and is bonded on the upper surface of the sidewall;
   a partitioned space is formed by the close-contact layer, the protrusions, and the sidewall on the surface of the jig base provided with the protrusions;
   the jig base is provided with at least one through hole penetrating the outside and the partitioned space; and
   the close-contact layer is configured to be deformed by sucking air in the partitioned space via the through hole of the fixing jig.

2. The method for producing a chip with an adhesive applied as defined in claim 1, wherein the die bonding adhesive layer and the wafer are laminated in this order via a release sheet on a close-contact layer of a fixing jig.

3. The method for producing a chip with an adhesive applied as defined in claim 1, wherein the wafer and the die bonding adhesive layer are laminated in this order via a protective pressure sensitive adhesive sheet on a close-contact layer of a fixing jig.

4. The method for producing a chip with an adhesive applied as defined in claim 3, wherein the wafer, the die bonding adhesive layer, and a release sheet for protecting the die bonding adhesive layer are laminated in this order on a close-contact layer of a fixing jig.

5. The method for producing a chip with an adhesive applied as defined in claim 1, wherein the wafer, the die bonding adhesive layer, and a release sheet for protecting the die bonding adhesive layer are laminated in this order on a close-contact layer of a fixing jig.

6. A method for producing a chip with an adhesive applied, the method comprising:
   providing a fixing jig comprising a close-contact layer and a jig base, the jig base having a plurality of protrusions on one side and a sidewall having a height substantially equivalent to that of the protrusion at the outer circumference section of the one side;
   laminating a die bonding adhesive layer and a segmented wafer on the close-contact layer of the fixing jig;
   completely cutting the die bonding adhesive layer in the shape of a chip; and
   picking up the chip together with the die bonding adhesive layer from the fixing jig by deforming the close-contact layer of the fixing jig,
   wherein:
   the close-contact layer is laminated on the surface of the jig base provided with the protrusions and is bonded on the upper surface of the sidewall;
   a partitioned space is formed by the close-contact layer, the protrusions, and the sidewall on the surface of the jig base provided with the protrusions;
   the jig base is provided with at least one through hole penetrating the outside and the partitioned space; and
   the close-contact layer is configured to be deformed by sucking air in the partitioned space via the through hole of the fixing jig.

7. The method for producing a chip with an adhesive applied as defined in claim 6, wherein the die bonding adhesive layer and the segmented wafer are laminated in this order via a release sheet on a close-contact layer of a fixing jig.

8. The method for producing a chip with an adhesive applied as defined in claim 6, wherein the segmented wafer and the die bonding adhesive layer are laminated in this order via a protective pressure sensitive adhesive sheet on a close-contact layer of a fixing jig.

9. The method for producing a chip with an adhesive applied as defined in claim 8, wherein the segmented wafer, the die bonding adhesive layer, and a release sheet for protecting the die bonding adhesive layer are laminated in this order on a close-contact layer of a fixing jig.

10. The method for producing a chip with an adhesive applied as defined in claim 6, wherein the segmented wafer, the die bonding adhesive layer, and a release sheet for protecting the die bonding adhesive layer are laminated in this order on a close-contact layer of a fixing jig.

\* \* \* \* \*

UNITED STATES PATENT AND TRADEMARK OFFICE
CERTIFICATE OF CORRECTION

PATENT NO. : 8,691,666 B2
APPLICATION NO. : 12/596047
DATED : April 8, 2014
INVENTOR(S) : Segawa et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1211 days.

Signed and Sealed this
Twenty-ninth Day of September, 2015

Michelle K. Lee
*Director of the United States Patent and Trademark Office*